(12) United States Patent
Wang et al.

(10) Patent No.: US 8,273,983 B2
(45) Date of Patent: *Sep. 25, 2012

(54) PHOTONIC DEVICE AND METHOD OF MAKING SAME USING NANOWIRES

(75) Inventors: Shih-Yuan Wang, Palo Alto, CA (US); R. Stanley Williams, Portola Valley, CA (US); Nobuhiko Kobayashi, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 996 days.

This patent is subject to a terminal disclaimer.

(21) Appl. No.: 12/244,939

(22) Filed: Oct. 3, 2008

(65) Prior Publication Data

US 2011/0168256 A1  Jul. 14, 2011

Related U.S. Application Data

(60) Provisional application No. 61/016,425, filed on Dec. 21, 2007.

(51) Int. Cl.
*H01L 31/00* (2006.01)
*H01L 31/042* (2006.01)

(52) U.S. Cl. ........ 136/258; 136/250; 136/255; 136/256; 257/51

(58) Field of Classification Search .................. 136/258, 136/255, 256, 293; 257/51
See application file for complete search history.

(56) References Cited

U.S. PATENT DOCUMENTS

| | | | |
|---|---|---|---|
| 4,772,335 A * | 9/1988 | Huang | ........................ 136/258 |
| 5,315,104 A | 5/1994 | Plumb | |
| 5,625,729 A | 4/1997 | Brown | |
| 6,249,010 B1 | 6/2001 | Bergemont et al. | |
| 6,451,702 B1 | 9/2002 | Yang | |
| 6,882,051 B2 | 4/2005 | Majumdar et al. | |
| 6,969,897 B2 | 11/2005 | Kim, II | |
| 7,020,372 B2 | 3/2006 | Lee et al. | |
| 7,083,104 B1 | 8/2006 | Empedocles et al. | |

(Continued)

FOREIGN PATENT DOCUMENTS

KR  10-2006-00376693  5/2006

(Continued)

OTHER PUBLICATIONS

P. Posiadlo, L. Sui, Y. Elkasabi, P. Burgardt, J. Lee, A. Miryala, W. Kusumaatmaja, M.R. Carman, M. Shtein, J. Kieffer, J. Lahann, N.A. Kotov, "Layer-by-Layer Assembled Films of Cellulose Nanowires with Antireflective Properties", Langmuir, p. 7901-7906 (2007).*

(Continued)

*Primary Examiner* — Jennifer Michener
*Assistant Examiner* — Marla D McConnell

(57) ABSTRACT

A photonic device, a method of making the device and a nano-scale antireflector employ a bramble of nanowires. The photonic device and the method include a first layer of a microcrystalline material provided on a substrate surface and a second layer of a microcrystalline material provided on the substrate surface horizontally spaced from the first layer by a gap. The photonic device and the method further include, and the nano-scale antireflector includes, the bramble of nanowires formed between the first layer and the second layer. The nanowires have first ends integral to crystallites in each of the first layer and the second layer. The nanowires of the bramble extend into the gap from each of the first layer and the second layer.

19 Claims, 2 Drawing Sheets

U.S. PATENT DOCUMENTS

| | | | |
|---|---|---|---|
| 7,172,953 | B2 | 2/2007 | Lieber et al. |
| 7,233,041 | B2 | 6/2007 | Duan et al. |
| 7,265,037 | B2 | 9/2007 | Yang et al. |
| 7,301,215 | B2 | 11/2007 | Kariya |
| 7,598,482 | B1 | 10/2009 | Verhulst et al. |
| 7,608,530 | B2 | 10/2009 | Kobayashi et al. |
| 7,875,884 | B2 | 1/2011 | Kobayashi et al. |
| 7,906,778 | B2 | 3/2011 | Kobayashi et al. |
| 8,183,566 | B2 | 5/2012 | Kobayashi et al. |
| 2003/0126742 | A1 | 7/2003 | Ting |
| 2005/0009224 | A1 | 1/2005 | Yang et al. |
| 2005/0011431 | A1 | 1/2005 | Samuelson et al. |
| 2005/0064185 | A1 | 3/2005 | Buretea et al. |
| 2006/0019472 | A1 | 1/2006 | Pan |
| 2006/0030132 | A1 | 2/2006 | Van Gestel et al. |
| 2006/0091407 | A1 | 5/2006 | Ko et al. |
| 2006/0207647 | A1 | 9/2006 | Tsakalakos et al. |
| 2006/0256059 | A1 | 11/2006 | Stumbo et al. |
| 2006/0281321 | A1 | 12/2006 | Conley |
| 2007/0105356 | A1 | 5/2007 | Wu |
| 2007/0137697 | A1 | 6/2007 | Kempa et al. |
| 2007/0221840 | A1 | 9/2007 | Cohen et al. |
| 2007/0257264 | A1 | 11/2007 | Hersee |
| 2008/0047604 | A1 | 2/2008 | Korevaar |
| 2008/0072818 | A1 | 3/2008 | Mostarshed |
| 2008/0092938 | A1 | 4/2008 | Majumdar et al. |
| 2008/0143906 | A1 | 6/2008 | Allemand et al. |
| 2008/0173971 | A1 | 7/2008 | Sharma |
| 2008/0210936 | A1* | 9/2008 | Kobayashi et al. ............. 257/51 |
| 2008/0241755 | A1 | 10/2008 | Franklin et al. |
| 2008/0251117 | A1* | 10/2008 | Schubert et al. ............. 136/255 |
| 2009/0188557 | A1 | 7/2009 | Wang |
| 2009/0189145 | A1 | 7/2009 | Wang |
| 2009/0211635 | A1 | 8/2009 | Niira et al. |
| 2009/0266974 | A1* | 10/2009 | Verhulst et al. ............ 250/208.1 |
| 2009/0317044 | A1 | 12/2009 | Buretea et al. |
| 2009/0321715 | A1 | 12/2009 | Kobayashi et al. |
| 2010/0012180 | A1 | 1/2010 | Day et al. |

FOREIGN PATENT DOCUMENTS

| | | | |
|---|---|---|---|
| WO | WO2006097189 A | * | 9/2006 |
| WO | WO-2006-138671 | | 12/2006 |

OTHER PUBLICATIONS

N.P. Kobayashi, Logeeswaran VJ, X. Li, M.S. Islam, J. Straznicky, S.Y. Wang, Z. Li, R.S. Stanley, "Indium Phosphide Nanowire Photoconductors on Non-single Crystalline Silicon-based Platform", Proceedings of the 7th IEEE (Aug. 2-5, 2007).*

D.S. Ruby, S.H. Zaidi, M. Roy, M. Narayanan, "Plasma Texturing Silicon Solar Cells", 9th workshop on Crystalline-Silicon Solar Cell Materials and Processes (1999) (pp. 1-4).*

N.P. Kobayashi, Logeeswaran VJ, M.S. Islam, X. Li, J. Straznicky, S.-Y. Wang, R.S. Williams, "Hydrogenated microcrystalline silicon electrodes connected by indium phosphide nanowires" Applied Physics Letters, 91, Sep. 14, 2007, p. 113116-1-113116-3.*

Mark S. Gudiksen et al., Size-Dependent Photoluminescence from Single Indium Phosphide Nanowires, J. Phys. Chem. B, 106 (2002) pp. 4036-4039.

Sreeram Vaddiraju et al., Mechanisms of 1D Crystal Growth in Reactive Vapor Transport: Indium Nitride Nanowires, Nano Letters, vol. 5, No. 8 (2005) pp. 1625-1631.

Pu Xian Gao et al., Three-dimensional Interconnected Nanowire Networks of ZnO, Chem. Phys. Letters, 408 (2005) pp. 174-178.

Wen-Ting Chiou et al., Growth of Single Crystal ZnO Nanowires using Sputter Deposition, Diamond and Related Materials, 12 (2003) pp. 1841-1844.

N. P. Kobayashi et al., Growth and characterization of indium phosphide single-crystal nanoneedles on microcrystalline silicon surfaces, Appl. Phys. A 85, (2006) pp. 1-6.

L. Tsakalakos et al., Silicon nanowire solar cells, Appl. Phys. Lett., 91 (2007) pp. 233117-1 to 233117-3.

Bogart et al., Diameter Controlled Synthesis of Silicon Nanowires Using Nanoporous Alumina Memebrales, Advanced Materials, vol. 17, No. 1, pp. 114-117, 2005.

* cited by examiner

PHOTONIC DEVICE AND METHOD OF MAKING SAME USING NANOWIRES

CROSS-REFERENCE TO RELATED APPLICATION

The present application claims priority from provisional application Ser. No. 61/016,425, filed Dec. 21, 2007, the contents of which are incorporated herein by reference in their entirety.

STATEMENT REGARDING FEDERALLY SPONSORED RESEARCH OR DEVELOPMENT

N/A

BACKGROUND

1. Technical Field

The invention relates to nanotechnology. In particular, the invention relates to a photonic device and a method of making the device that incorporate nanowires.

2. Description of Related Art

Historically, high performance semiconductor devices, especially those with p-n junctions, comprise single crystals of one or more semiconductor materials. Among other things, using such single crystalline materials for semiconductor devices essentially eliminates the scattering of charged carriers (e.g., holes and electrons) at grain boundaries that exist in non-single crystalline semiconductor materials such as polycrystalline semiconductor materials. Such scattering adversely reduces the drift mobility and the diffusion of charged carriers, and leads to a degraded performance (e.g., increased resistance) of devices, such as transistors and solar cells. Even when different semiconductor materials were employed together in a single device, such as in a heterostructure or heterojunction device, single crystalline semiconductor materials are generally chosen based on their respective lattice structures to insure that the structure realized is an essentially single crystalline structure as a whole. Similarly, nanostructures including, but not limited to, nanowires and nanodots are typically nucleated and grown from single crystalline substrates, in part to capitalize on the uniform nature of the lattice of such substrates that provides required crystallographic information for the nanostructures to be grown as single crystals.

Relatively recently, amorphous and other essentially non-single crystalline semiconductor materials have begun to attract attention, in particular, in solar cell and silicon photonics applications. While having the disadvantages associated with multiple grain boundaries, such non-single crystalline semi cot) doctor materials can be considerably cheaper to manufacture than their single crystalline counterparts. In many applications, the lower cost of producing the semiconductor device from non-single crystalline materials may outweigh any loss of performance that may or may not result. Furthermore, using non-single crystalline semiconductor materials for heterostructures can increase the possible combinations of materials that can be used since lattice mismatch is less of a concern with non-single crystalline semiconductors.

For example, heavily doped poly crystalline Silicon (Si) is commonly used instead of or in addition to metal for conductor traces in integrated circuits where the heavy doping essentially overcomes the increased resistivity associated with carrier scattering from the multiple grain boundaries. Similarly, poly crystalline Si is commonly used in solar cells where its relatively lower cost outweighs the decrease in performance associated with the nature of the polycrystalline material. Amorphous semiconductor material is similarly finding applications in solar cells and in thin film transistors (TFTs) for various optical display applications where cost generally dominates over concerns about performance.

Unfortunately, the ability to effectively combine non-single crystalline semiconductor materials with single crystalline semiconductor materials to realize semiconductor junction-based devices aid heterostructure or heterojunction devices has generally met with little success. In part, this is due to the disruptive effects that joining a single crystalline layer to a non-single crystalline layer has on the physical properties of the single crystalline layer. As such, devices that employ nanostructures as active elements typically use single crystalline materials to interface to single crystalline nanostructures. For example, solar cell devices that incorporate nanowires employ single crystalline materials to form semiconductor junctions.

BRIEF SUMMARY

In some embodiments of the present invention, a photonic device is provided that comprises a first layer of a microcrystalline material on a substrate surface; and a second layer of a microcrystalline material on the substrate surface. The second layer is horizontally spaced from the first layer by a gap. The photonic device further comprises a bramble of nanowires between the first layer and the second layer. The nanowires of the bramble have first ends integral to crystallites in each of the first layer and the second layer. The nanowires of the bramble extend into the gap from each of the first layer and the second layer.

In other embodiments of the present invention, a photonic device is provided that comprises a first layer of a microcrystalline material on a substrate surface; and a second layer of a microcrystalline material on the substrate surface. The second layer is horizontally spaced from the first layer by a gap. The photonic device further comprises a nano-scale antireflector in the gap between the first layer and the second layer. The nano-scale antireflector is light absorptive both in a wide band of optical frequencies and over a wide range of incident angles, such that negligible light is reflected from the gap.

In other embodiments of the present invention, a method of making a photonic device is provided. The method of making comprises providing a first layer of a microcrystalline material on a substrate surface. A second layer of a microcrystalline material is provided horizontally spaced from the first layer by a gap. The method of making further comprises forming a bramble of nanowires between the first layer and the second layer. The nanowires of the bramble have first ends integral to crystallites in each of the first layer and the second layer, such that the nanowires of the bramble extend into the gap from opposing directions.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
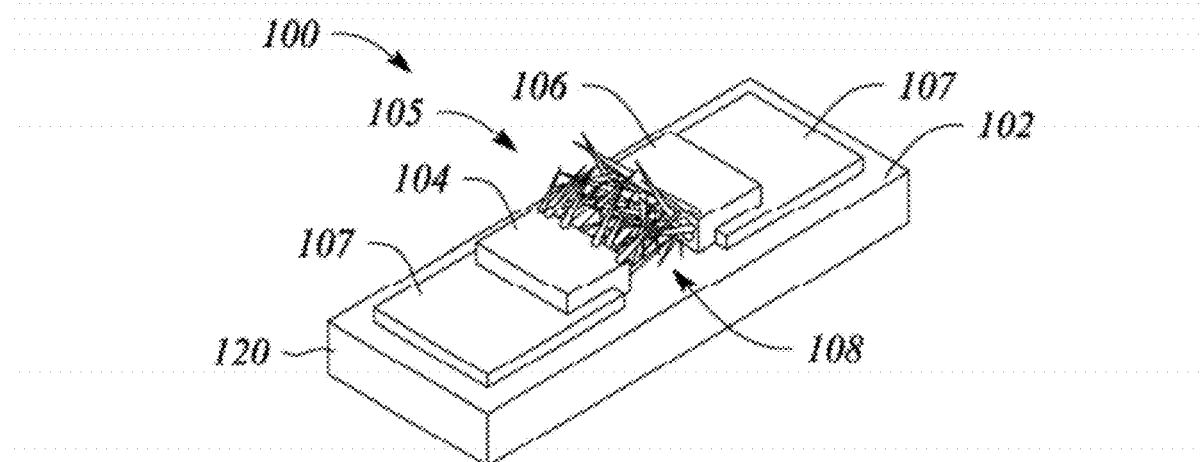
FIG. 1A illustrates a perspective view of a photonic device according to an embodiment of the present invention.

Embodiments of the present invention provide a photonic device that employs a bramble of nanowires as air active photonic component. In some embodiments, photonic device employs the bramble of nanowires further as a nano-scale antireflector. The bramble of nanowires is a plurality of randomly oriented nanowires that are integral at one end to a microcrystalline layer of the photonic device. The bramble may provide one or both enhanced light absorbing characteristics and enhanced antireflective characteristics to the photonic device. Effectively, the random orientations of the nanowires in the bramble increase the probability that photons will interact with and be absorbed by the nanowires rather than be lost (e.g., reflected) to the surroundings. Typical antireflective (AR) coatings absorb light in a relatively narrow-band of frequencies. In addition, such typical AR coatings are generally directionally dependent providing antireflection over only a narrow range of incident angles. In contrast, the nano-scale antireflector of the present invention absorbs a wide hand of frequencies of light and over a wide range of incident angles. The bramble of nanowires of the nano-scale antireflector provides overall better light absorbing or trapping ability than typical AR coatings. Thus, in some embodiments, the bramble of nanowires may be useful in a wider range of applications than typical AR coatings. Specifically, the bramble of nanowires may be better suited than typical AR coatings to applications in which light is absorbed such as, but not limited to, when light is to be converted to other forms of energy.

The photonic device comprises a microcrystalline material layer that, by definition, has short range atomic ordering. The photonic device further comprises a plurality of nanowires that is integral, to (i.e., nucleated and grown from) the microcrystalline material layer, such that the nanowires are single crystalline and have random orientations relative to a plane of the microcrystalline layer. In particular, individual nanowires within the bramble are associated with the short-range atomic ordering of the microcrystalline material layer. Crystallographic information associated with the short-range atomic ordering is transferred to the nanowires during growth of the nanowires. The integral crystal-structure connection at the interface between the microcrystalline material layer and the single crystalline nanowires facilitates using the interface in a variety of semiconductor junction-related device applications including, but not limited to, optoelectronic device (e.g., photodetectors, LEDs, lasers and solar cells) and electronic device (e.g., tunneling diodes and transistors) applications. Such devices are collectively referred, to herein as a 'photonic device'. The photonic device according to various embodiments herein may have enhanced device performance due to the combined contributions of the integral microcrystalline/ nanowire interfaces and the additional surface area provided by the bramble of nanowires.

According to the various embodiments herein, the photonic device comprises a semiconductor junction provided by selective doping within or between the materials or layers. For example, a p-n junction may be formed when the nanowires are doped with an n-type dopant and the microcrystalline material layer is a semiconductor material doped with a p-type dopant. In another example, a p-n junction is formed entirely by or within the nanowires. In other embodiments, an intrinsic layer is formed between a p-region and an n-region to yield a p-i-n junction within the photonic device. For example, a portion of the nanowires may be n-doped while another portion thereof is essentially undoped (e.g., intrinsic) and the microcrystalline layer is p-doped. In other embodiments, multiple p-n junctions, p-i-n junctions and combinations thereof are formed in or between the nanowires and microcrystalline layer(s) as is discussed in more detail below. For simplicity of discussion and not by way of limitation, the term 'p-n junction' means herein one or both of the p-n junction and the p-i-n junction unless explicit distinction is necessary for proper understanding.

Further, according to various embodiments, the photonic device may comprise a heterostructure or a heterojunction semiconductor device. For example, semiconductor materials having differing band gaps are employed to respectively realize the single crystalline nanowires and the microcrystalline semiconductor layer of some photonic device embodiments of the present invention. The photonic device that comprises such differing materials is termed a heterostructure photonic device.

Herein, a 'microcrystalline' material is defined as a non-single crystalline material that has a structure with short range atomic ordering and as such, the material lacks long-range atomic ordering. In contrast, as used herein, a 'single crystalline' material has a crystal lattice structure that is essentially continuous in micrometer scale, as generally defined for a single crystal (i.e., has long-range atomic ordering). A microcrystalline structure is a subset of a polycrystalline structure, which also has short range atomic ordering. The short range atomic order of a microcrystalline structured material has a much smaller extent than the short range atomic order of a poly crystalline structured material. For example, the short range atomic ordering (or order) of a microcrystalline material ranges in extent from about 1 nanometer to about 500 nanometers, in accordance with some embodiments of the present invention. By way of example, a poly crystalline material has short range atomic ordering with a much larger extent that ranges from about 0.01 nanometer to about 100 microns.

Moreover, the short range atomic ordering of a microcrystalline material manifests as multiple, small regions of crystalline material or 'crystallites' dispersed within and generally throughout the microcrystalline material. The regions of crystallites may range from clusters of individual crystallites to discrete individual crystallites. Thus, by definition, the microcrystalline material comprises multiple crystallites buried in an amorphous matrix. Adjacent crystallites within the microcrystalline material layer have respective lattices that are essentially randomly oriented with respect to one another. Further, crystallites adjacent to a surface of the microcrystalline material layer are essentially randomly located across the surface. The crystallites in the microcrystalline material essentially define the short range atomic ordering of the material.

The term 'hetero-crystalline' is defined herein as a structure comprising at least two different types of structural phases. In particular, herein a hetero-crystalline structure comprises at least a microcrystalline material having crystallites, as defined herein, and a single crystalline material that is integral to a crystallite of the microcrystalline material.

With respect to the various embodiments of the present invention, the microcrystalline material, as defined herein, provides a template for nucleation and growth of a single crystalline nanometer-scale semiconductor structure (i.e., 'nanostructure'). In particular, a crystallite of the microcrystalline material layer provides a nucleation site for growth of a single crystalline nanostructure. The random orientations and distribution of the crystallites in the microcrystalline layer dictate both random orientations and random locations of the nanostructure. The nucleation site includes within its scope, but is not limited to, growing one or more nanostructures either from a single crystallite or from an aggregate or cluster of crystallites of the microcrystalline layer, depending on the size of crystallites.

For example, if the size of a single crystallite is 'large' compared to the size of a nanostructure, more than one nanostructure may grow from the single crystallite. On the other hand, if the size of a single crystallite is 'small' compared to the size of the nanostructure, but many such crystallites aggregate to form a large crystallite area, then a single nanostructure, or even multiple nanostructures, can grow from such a group of crystallites. As used herein, the term 'crystallite' means a range of crystallites from a single crystallite to a group of crystallites aggregated together for the purposes of the various embodiments of the present invention. The grown nanostructure forms an interface with the crystallite where the nanostructure is connected to the crystallite commensurately. As such, the nanostructure is said to be 'integral to' a crystallite of the microcrystalline material. In some embodiments, the structure of the microcrystalline layer material is non-single crystalline (e.g., is the amorphous matrix or another crystallite) in a space between two adjacent nanostructures (i.e., nearest neighbors) that are integral to respective crystallites of the microcrystalline layer.

In some embodiments, the nanostructure is a nanowire. A nanowire is an individual quasi-one dimensional, nano-scale structure typically characterized as having two spatial dimensions or directions that are much less that) a third spatial dimension or direction. The presence of the third, greater dimension in nanowires facilitates electron wave functions along that dimension while conduction is quantized in the other two spatial dimensions. As used herein, the term nanowire is defined as a single-crystalline nano-scale structure, as described above, having an axial length (as a major or third spatial dimension), opposite ends and a solid core. A nanowire also may be one of larger than, smaller than and the same size as the crystallite to which it is integrally attached. Moreover, the nanowire may one or both of have dimensions from tens of nanometers to several hundred nanometers and not have the same dimension along the entire length of the nanowire, for example. As such, the nanowire may have a tapered shape or a non-tapered shape and such shape may be uniform or non-uniform along the axial length of the nanowire. In some embodiments, the nanowire is a semiconductor material.

In some embodiments, the nanostructure is a nanotube that is characterized as having two spatial dimensions or directions that are much less than a third spatial dimension or direction. In some embodiments, the nanotube is a semiconductor material. A nanotube is defined as a single-crystalline nano-scale structure having an axial length (as a major or third spatial dimension), opposite ends and, in contrast to a nanowire, has a hollow core.

In other embodiments, the nanostructure comprises a nanodot (i.e., a quantum dot (QD)). A nanodot is a single crystalline, quasi zero-dimensional nanostructure that is nanometer-scale (i.e., nano-scale) in all three spatial dimensions or directions and electron wave functions in the nanodot is quantized in all three spatial dimensions. The term 'nanowire' may be used herein to collectively refer the above-described single crystalline nanostructures unless a distinction is necessary.

Each of the above-mentioned nanostructures may be nucleated and grown from microcrystalline materials, as defined herein, i.e., the microcrystalline material layer, according to the various embodiments herein. An exemplary list of microcrystalline materials useful for the embodiments of the present invention is provided below. As such, a wide variety of materials are available to manufacture the photonic device embodiments of the present invention. The wide variety of available microcrystalline materials may provide a plethora of potential device applications. For example, the photonic device according to various embodiments herein include, but are not limited to a solar cell, a laser, a photodetector, a light emitting diode (LED), a transistor and a photodiode.

In addition, using a wide variety of microcrystalline materials may provide cost and manufacturing advantages as well as performance advantages to the photonic device according to some embodiments. For example, a solar cell device that can be manufactured using microcrystalline semiconductor materials with single crystalline nanostructures may be one or both of more cost-effective to make and more efficient compared to conventional solar cells based on single crystalline silicon with single crystalline nanostructures, according to some embodiments, simply due to the fact that expensive single crystal substrates/layers are not necessary and a broader range of materials that are available for solar cell structures. Material and relevant manufacturing costs for microcrystalline semiconductor materials are generally cheaper than those for single crystalline semi conductor materials. Moreover, the greater variety of these available materials may provide for energy conversion from more of the solar spectrum than previously available, which may improve solar cell efficiency according to some embodiments. In addition, some of the photonic device embodiments of the present invention provide for smaller or more compact construction.

Likewise, incorporating a bramble of nanowires that comprises a plurality of nanowires with random orientations integral to the microcrystalline material layer provides one or both of increased surface area for photon capture and increased probability that photons will interact with the nanowires or the semiconductor junctions of the photonic device. As such, one or both of light absorption and antireflection may be enhanced in some embodiments. The increased surface area and the increased probability are relative to photonic devices that incorporate predominantly substantially perpendicular nanostructures (e.g., a relatively ordered and uniform array of nanowires) and planar surfaces for photon capture, or incorporate typical AR coatings. For example, various embodiments of the invention may provide solar cells with greater energy conversion efficiency compared to conventional single crystalline solar cells using one or both of predominantly substantially perpendicular nanowires or typical AR coatings.

The bramble of nanowires has essentially random nanowire orientations dictated by the random or disordered lattice orientations of the crystallites in the microcrystalline material layer. As such, the nanowires of the bramble are referred to as being 'tangled' for simplicity of discussion herein. For the purposes of the various embodiments herein, the 'bramble of nanowires' is defined as a disordered plurality of nanowires that has a wide distribution of angular orientations of the nanowires. The wide distribution of angular orientations is related to the disordered lattice orientations of the crystallites to which the nanowires of the bramble are coherently attached (i.e., integral to).

The term 'wide distribution of angular orientations' of the disordered plurality of nanowires in the bramble means that the nanowires have a broad range of angular orientations where no angular orientation is predominant over other angular orientations (i.e., non-uniform). In other words, there is no predetermined order and no resulting order to the angular orientations of the nanowires in the bramble. This is in stark contrast to an ordered array of nanowires, where most of the nanowires are expected to and do grow in a primary direction on a single crystalline material layer or on a layer of uniform nanocrystals or nanoparticles (e.g., having predominantly substantially perpendicular nanowires).

As provided below, the nanowires grow integral to a microcrystalline material layer that is on a substrate having a horizontal surface. The microcrystalline layer has a horizontal surface that is generally parallel to the substrate surface. Moreover, the microcrystalline layer further has a vertical surface that is generally perpendicular to the substrate surface. The nanowires grow integral to the vertical surface as well as the horizontal surface. For the purposes of consistency herein, the angular orientations of the nanowires that grow integral to each of the horizontal surfaces and the vertical surfaces of the microcrystalline layer are measured with respect to a horizontal plane parallel to the substrate surface.

In some embodiments, the wide distribution of angular orientations includes angles from less than zero (0) degrees to 90 degrees as measured from the horizontal plane parallel to the substrate surface. For example, 'less than zero (0) degrees' may include angular orientations ranging from about −1 degree to −90 degrees as measured from the horizontal plane parallel to the substrate surface. In some embodiments, the wide distribution of angular orientations includes angles greater than zero (0) degrees to less than 90 degrees as measured from the horizontal plane parallel to the substrate surface.

In some embodiments, the wide distribution of angular orientations is approximated by a broad Gaussian distribution. For example, the wide distribution may have a mean angular orientation value of about −70 degrees to about +70 degrees. Ultimately, a randomness (i.e., width) of the distribution is related to a randomness of lattice orientations of the crystallites in the microcrystalline layer. As mentioned above, the nanowires of the bramble extend from vertical surfaces as well as from horizontal surfaces of the microcrystalline layer. As such, the wide distribution of angular orientations of the bramble includes angles less than zero (0) degrees as measured from a horizontal plane parallel to the substrate surface.

In contrast, nanowires that grow on a single crystalline material layer or a layer of nanocrystals or nanoparticles are substantially uniformly oriented with the uniform crystal lattice orientation of the single crystals (e.g., uniformly substantially perpendicular to a [111] lattice direction). Therefore, the angular orientations of nanowires integral to a single crystalline material layer or a layer of nanocrystals or nanoparticles have a negligible distribution of angular orientations relative to the wide distribution of angular orientations of the nanowires integral to a microcrystalline material layer according to the various embodiments of the present invention.

For the purposes of the various embodiments herein, the article 'a' or 'an' is intended to have its ordinary meaning in the patent arts, namely 'one or more'. For example, 'a nanowire' means 'one or more nanowires' and as such, 'the nanowire' means 'the nanowire(s)' herein. Moreover, 'a crystallite' means 'one or more crystallites' and includes within its scope 'a group of crystallites', as defined above. It is irrelevant whether a particular layer is described herein as being a 'first' layer or a 'second' layer, or being on a top or upper side, a bottom or lower side, or on a left side or a right side of other layers of the photonic device. Therefore, any reference herein to 'first', 'second', 'top', 'bottom', 'upper', 'lower', 'left' or 'right' with respect to the layers is not intended to be a limitation herein. Moreover, examples described herein are provided for illustrative purposes only and not by way of limitation.

The use of brackets '[ ]' herein in conjunction with such numbers as '111' and '110' pertains to a direction or orientation of a crystal lattice and is intended to include directions '< >' within its scope, for simplicity herein. The use of parenthesis '( )' herein with respect to such numbers as '111' and '110' pertains to a plane or a planar surface of a crystal lattice aid is intended to include planes '{ }' within its scope for simplicity herein. Such uses are intended to follow common crystallographic nomenclature known in the art.

In some embodiments of the present invention, a photonic device is provided that comprises a first layer of a microcrystalline material on a substrate surface; a second layer on the substrate surface horizontally spaced from the first layer by a gap; and a bramble of nanowires extending between the first layer and the second layer. The microcrystalline material comprises crystallites, both terms as defined herein. Adjacent crystallites within the microcrystalline material layer have respective lattices that are essentially randomly oriented with respect to one another. Further, crystallites adjacent to a surface of the microcrystalline material layer are essentially randomly located across the surface. The bramble of nanowires comprises a plurality of nanowires in a disordered and non-uniform array. The nanowires have first ends that are integral to the crystallites in each of the first layer and the second layer. The nanowires of the bramble plurality further have second ends that are opposite the first ends. In some embodiments, the second end of the nanowire comprises a metallic tip. The bramble of nanowires is defined above. In some embodiments, a cross-sectional width dimension of the nanowires in the bramble ranges from about 40 nm to about 500 nm. In some embodiments, the width dimension of the nanowires in the bramble is not less than about 100 nm. For both photonic device applications and antireflection applications, wider nanowires provide better absorption of photons than narrower nanowires in some embodiments. Moreover, the band gap of the nanowire material may be less blue-shifted for wider nanowires than for narrower nanowires in some embodiments.

Figure 1B:
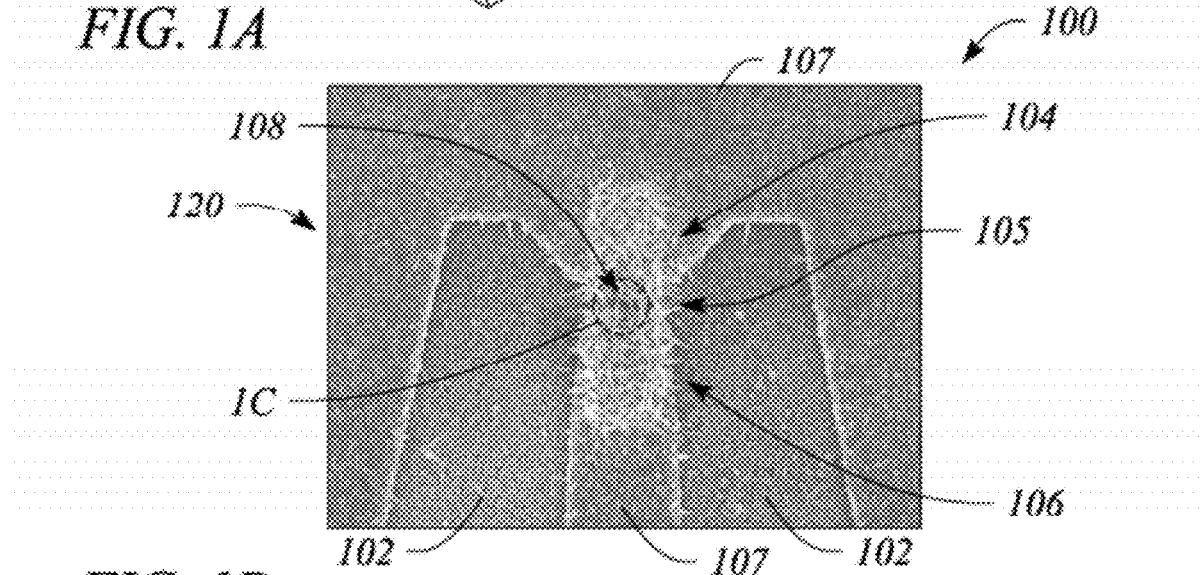
FIG. 1B is a scanning electron microscope (SEM) photograph that illustrates a top view of a photonic device according to an embodiment of the present invention.
Figure 1C:
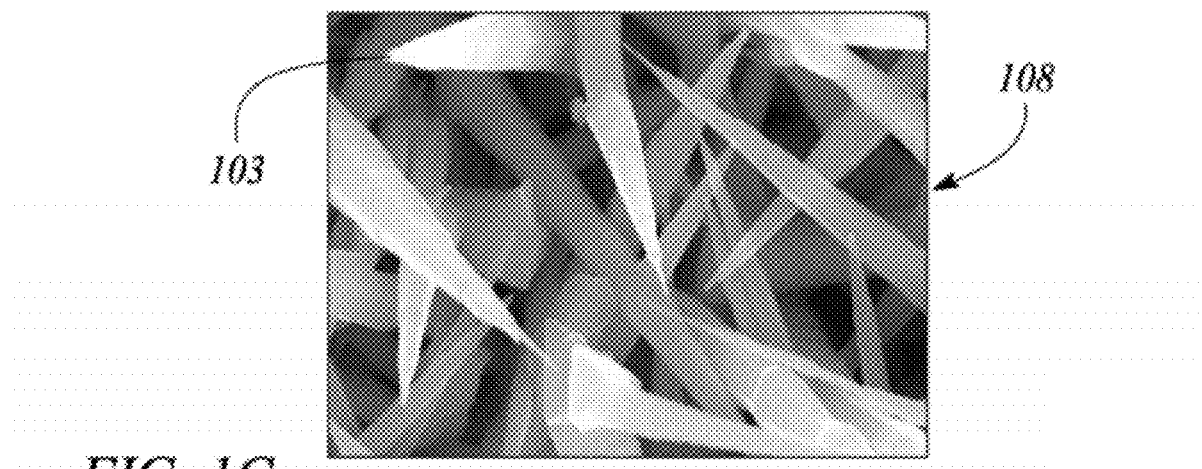
FIG. 1C is a SEM photograph that illustrates a magnified view of a bramble of nanowires on the photonic device of FIG. 1B according to an embodiment of the present invention.

FIG. 1A illustrates a perspective view of a photonic device 100 according to an embodiment of the present invention. FIG. 1B is a SEM photograph that illustrates a top view of a photonic device 100 according to an embodiment of the present invention. FIG. 1C is a SEM photograph that illustrates a magnified view of a bramble of nanowires from the photonic device 100 illustrated in FIG. 1B according to an embodiment of the present invention.

With respect to FIGS. 1A and 1B, the photonic device 100 comprises a first layer 104 of a microcrystalline material on a substrate surface 102. The photonic device 100 further comprises a second layer 106 of a microcrystalline material on the substrate surface 102 horizontally spaced from the first layer 104 by a gap 105. The first layer 104 and the second layer 106 have respective vertical surfaces and horizontal surfaces relative to the plane of the substrate surface 102. The vertical surfaces of the first layer 104 and the second layer 106 face each other and define the gap 105 space. Both the vertical surfaces and the horizontal surfaces of the first layer 104 and the second layer 106 comprise the above-described crystallites of the respective microcrystalline materials.

The photonic device 100 further comprises a bramble of nanowires 108, as defined above, between the first layer 104 and the second layer 106. Nanowires are integral to each of the horizontal surfaces and the vertical surfaces of the first layer 104 and the second layer 106, as illustrated in FIG. 1B. However, for the purposes of these embodiments, the region of interest is the space between the vertical surfaces of the layers 104, 106, or the gap 105. As such, in FIG. 1A, a majority of the nanowires that are integral to the horizontal surfaces of the layers 104, 106 are omitted for clarity only. In the embodiments illustrated in FIGS. 1A and 1B, the bramble of nanowires 108 comprises the nanowires integral to the first layer 104 that extend into the gap 105 and the nanowires integral to the second layer 106 that extend into the gap 105. The nanowires extend into the gap 105 in opposing directions and are intertwined or tangled together at random orientations to create a relatively dense population of nanowires. The dense population is compared to one or both of nanowires extending from just one of the first layer or the second layer into the gap and nanowires extending uniformly into the gap in an ordered array.

In some embodiments, a nanowire of the bramble 108 that extends into the gap 105 from the vertical surface of the first layer 104 or the second layer 106 extends across the gap 105 to connect to the respective facing vertical surface. In some of these embodiments, the second end of the nanowire comprises a metallic tip. A metallic tip on the second end of the nanowire facilitates an electrical connection between the first layer 104 and the second layer 106. Moreover, in some embodiments, a nanowire of the bramble 108 connects with another nanowire across the gap 105, for example opposing nanowires from the first layer and the second layer that make contact at a second end. In some of these embodiments, the second end of the nanowire comprises a metallic tip that facilitates an electrical connection between nanowires. The metallic tip is not illustrated in FIGS. 1A and 1B, but is illustrated in FIG. 1C, by way of example.

In some embodiments, individual nanowires of the bramble 108 intersect one another during growth such that lattices of the individual nanowires merge with one another. Therefore, some nanowires of the bramble of nanowires 108 are essentially 'integrally tangled' with other nanowires of the bramble 108, in some embodiments. FIG. 1C provides a magnified view of a portion of the plurality of tangled nanowires of the bramble 108 depicted in FIG. 1B. A metallic tip 103 on the second end of a nanowire is illustrated in the magnified view of the nanowire bramble 108 of FIG. 1C for example.

As mentioned above, the nanowires are integral to crystallites in the first layer 104 and the second layer 106. By 'integral to', it is meant that the crystallites of respective microcrystalline layers and the single crystalline nanowires form an interface where the lattice of the nanowires is coherent with the lattice of the respective crystallites. The coherent lattices of the heterocrystalline materials facilitate charge carrier transport through the interface, for example. The crystallite provides a nucleation site for the epitaxial growth of the single crystalline nanowire during manufacturing of the photonic device 100. As such, the nanowires are also physically anchored to the crystallites of microcrystalline material layer. FIGS. 1A and 1B illustrate the bramble of nanowires 108 anchored at a first end of the nanowires to the crystallites of the respective first and second layers 104, 106. Moreover, second ends of the nanowires that are opposite to the first ends are one or more of free, tangled with other nanowires, connected to opposing nanowires from across the gap 105, and connected to a facing vertical surface across the gap 105.

Moreover, since the crystallites of the microcrystalline material have randomly oriented crystal lattices in adjacent crystallites, the direction of nanowire growth is essentially random. FIGS. 1A-1C further illustrate the various random and non-uniform directions of the nanowires in the bramble 108 by way of example. Furthermore, the crystallites are randomly located in the respective surfaces of the first layer 104 and the second layer 106 and not all crystallites in the respective surfaces will nucleate growth of a nanowire. As such, growth of the nanowires of rite bramble 108 in any particular location on the respective surfaces is also essentially random. FIG. 1A further illustrates the random locations of the nanowires of the bramble 108 grown on the respective surfaces of the first layer 104 and the second layer 106 by way of example. In some embodiments, the bramble of nanowires 108 in the gap 105 of the photonic device of FIGS. 1A-1C have a wide distribution of angular orientations, as defined above, that includes angular orientations less than zero (0) degrees, as measured from a horizontal plane parallel to the substrate surface.

In some embodiments, the photonic device 100 further comprises separate electrical contacts. FIGS. 1A and 1B illustrate separate electrical contacts 107 adjacent to the first layer 104 and the second layer 106 on the substrate surface 102. The bramble of nanowires 108 is electrically accessible in conjunction with the first and second layers 104, 106 by the separate electrical contacts 107.

The electrical contacts 107 are made from a material that includes, but is not limited to, a conductive metal and a semiconductor material that is doped to provide the electrical conductivity for the photonic device 100 application. In some embodiments, the material of the electrical contacts 107 is either transparent or semi-transparent to electromagnetic radiation in one or more of visible, UV and IR spectrums. For simplicity of discussion, herein, the term 'optically transparent' may be used to describe 'either transparent or semi-transparent to electromagnetic radiation in one or more of visible, UV and IR spectrums'.

The photonic device 100 embodiments illustrated in FIGS. 1A and 1B are exemplary of a photodetector device, for example. Photons of light are detected by the bramble of nanowires 108 in the vicinity of the gap 105. The bramble of nanowires 108 facilitates one or both of the capture of a photon in the tangled nanowire plurality and absorption at a p-n junction of the photodetector device 100, where for example, the nanowires may be undoped and the microcrystalline layers 104, 106 are alternately n-doped or p-doped. Absorption at the p-n junction may result in the formation of an electron-hole pair within the p-n junction. Movement of the electron and hole in respective separate directions away from the junction results in a photocurrent associated with the photodetector device 100. As such, the bramble of nanowires 108 facilitate one or both of enhanced light absorption and enhanced antireflection of the light, such that the photodetector device 100 is more sensitive to light and therefore, more robust as a photodetector than a photodetector without the bramble of nanowires. For example, the photodetector 100 may be more robust than a photodetector with a relatively ordered array of nanowires having a substantially uniform angular orientation (i.e., a negligible distribution of angular orientations). For example, a photodetector where the nanowires are predominately substantially perpendicular to the horizontal and vertical surfaces from which the ordered array of nanowires extends.

The photonic device 100 illustrated in FIGS. 1A and 1B is also exemplary of a solar cell in some embodiments. Photons are captured in the bramble of nanowires 108 in the gap 105. The bramble of nanowires 108 facilitates one or both of the capture of a photon in the tangled nanowire plurality and the likelihood that the photon will interact with a p-n junction associated with the bramble 108 and generate an electron-hole pair. The first layer 104 and the second layer 106 have low contact resistance and facilitate the generation of an electric current. As mentioned above with respect to the photodetector 100, generation of an electric current (i.e., photocurrent) occurs when the electrons and holes generated by photon absorption move away from the p-n junction. For example, the electrons move away in a first direction (e.g., toward the first layer 104) and the holes move away in a second, opposite direction (e.g., toward the second layer 106) as a result of an electric field gradient associated with the p-n junction. As such, the bramble of nanowires 108 facilitates one or both of enhanced light absorption and enhanced antireflection of the light, such that the solar cell device 100 may provide better light conversion efficiency and therefore, is more robust as a solar cell than a solar cell without the bramble of nanowires. For example, the solar cell device 100 may be more robust than a solar cell with an ordered or uniform array of nanowires (i.e., having a negligible distribution of angular orientations).

In some embodiments, the bramble of nanowires 108 is a nano-scale antireflector 108 for devices that convert light to other forms of energy including, but not limited to, current (e.g., photonic device 100) and heat (e.g., a blackbody radiator). The dense population of randomly oriented nanowires in the gap 105 absorbs light in a wide band of optical frequencies and over a wide range of incident angles, such that negligible light is reflected from the gap. In some embodiments, the gap 105 absorbs light in one or both of essentially frequency independent and essentially incident angle independent (e.g., isotropic) manner. Thus, the bramble of nanowires 108 is an efficient nano-scale antireflector 108 with broad application compared to typical antireflective coatings, for example.

In some embodiments, the photonic device 100 further comprises a horizontal substrate 120 that has the aforementioned substrate surface 102, as illustrated in FIGS. 1A and 1B. The substrate 120 is adjacent to the first layer 104, the second layer 106, as well as the electrically contacts 107 as illustrated in FIGS. 1A and 1B. The substrate 120 provides mechanical support to the photonic device 100 by physically supporting at least the first layer 104 and the second layer 106 on the surface 102 thereof. In other embodiments, the substrate 120 may provide addition functionality including, but not limited to, an electrical interface to the photonic device 100 and an optically transparent pathway for light to further enter the gap 105 through the substrate 120. In general a broad range of materials are useful as the substrate 120 for the photonic device 100 of the various embodiments herein.

For example, the material of the substrate 120 includes, but is not limited to, a glass, a ceramic, metal, a plastic, a polymer, a dielectric and a semiconductor. A substrate material useful for the various embodiments herein includes materials that have one of no crystallographic structure (e.g., amorphous), a microcrystalline structure (i.e., having short range atomic order, as defined herein), a poly crystalline structure (i.e., having short range atomic order of relatively greater extent than a microcrystalline structure, as defined herein), and a single crystalline structure (i.e., having relatively long range atomic order). In some embodiments, the substrate material is chosen at least for its ability to withstand manufacturing temperatures at or above about 100 degrees centigrade (° C.). In various embodiments, the substrate 120 may be one of rigid, semi-rigid and flexible, depending on specific applications of the photonic device 100. Moreover, the substrate 120 may be one of reflective, opaque, transparent and semi-transparent to electromagnetic radiation in one or more of visible, ultra-violet (UV) and infra-red (IR) spectrums, depending on the application of the photonic device 100. For the photonic device 100 embodiments illustrated in FIGS. 1A and 1B, the substrate 120 is a material that electrically isolates the first layer 104 from the second layer 106 (including isolating the electrical contacts 107 from one another) on the substrate surface 102.

A microcrystalline material includes, but is not limited to, an insulator, a semiconductor, a metal and a metal alloy provided on the substrate as a thin film. For the purposes of the various embodiments of the present invention, the microcrystalline material used herein is a semiconductor material. In some embodiments, one or both of a metal material and metal alloy material may be used as a microcrystalline layer in the present invention due to their non-insulative character (i.e., an inherent non-insulator or inherently electrically conductive), depending on the device application.

The microcrystalline semiconductor materials of the first layer 104 and the second layer 106 independently include, but are not limited to, Group IV semiconductors, compound semiconductors from Group III-V and compound semiconductors from Group II-VI having a microcrystalline structure, as defined herein. As such, the semiconductor material of the first layer 104 may be the same as or different from the semiconductor material of the second layer 106, depending on the embodiment.

For example, the first layer 104 may comprise silicon (Si) in a microcrystalline film while the second layer 106 may comprise germanium (Ge) or gallium arsenide (GaAs) in a microcrystalline film. In another example, the first layer 104 may comprise a hydrogenated silicon (Si:H) microcrystalline film while the second layer 106 comprises microcrystalline silicon (Si). In the embodiment illustrated in FIG. 1B, both the first layer 104 and the second layer 106 comprise a hydrogenated silicon (Si:H) microcrystalline film and the nanowires of the bramble are single-crystalline indium phosphide (InP) nanowires.

In some embodiments, the nanowires comprise a single crystalline semiconductor material. Single crystalline semiconductor materials of the nanowires also independently include, but are not limited to, Group IV semiconductors, compound semiconductors from Group III-V and compound semiconductors from Group II-VI. Therefore, the semiconductor material of the nanowires in the bramble 108 may be the same as or different from the semiconductor material of one or both of the first layer 104 and the second layer 106, depending on the embodiment, but the semiconductor materials of the respective layers 104, 106 are microcrystalline layers. For example, the semiconductor material of the first layer 104, the nanowires and the second layer 106 may each be silicon; however the first and second layers 104, 106 are microcrystalline Si in this example and the nanowires are single crystalline Si. In another example, the semiconductor material of the first layer 104 may be microcrystalline Si:H, the semiconductor material of the nanowires may be indium phosphide (InP), and the semiconductor material of the second layer 106 may be microcrystalline Si, depending on the embodiment.

In some embodiments, one or both of the single crystalline nanowires and the microcrystalline films are independently a material that forms one of a zincblende lattice structure and a diamond lattice structure. For example, zincblende and diamond lattice structures may be more conducive to a metal-catalyzed nanowire growth process than one or both of a wurtzite lattice structure and a rock-sail lattice structure. In some embodiments, one or both of the single crystalline nanowires and the microcrystalline films independently excludes materials that form one of the wurtzite lattice structure and the rock-salt lattice structure. A description of crystal lattice structures can be found in the textbook by Sze, S. M., *Physics of Semiconductor Devices*, Second Edition, John Wiley & Sons, Inc. 1981, on pp. 8-12 and in Appendix F, pg. 848, for example.

In some embodiments, concomitant with a choice of the semiconductor materials independently used in the first layer 104, the bramble of nanowires 108 and the second layer 106 is a respective energy band gap of the respective materials. In some embodiments of the photonic device 100, the energy band gap of the bramble of nanowires 108 is different from the energy band gap of one or both of the first layer 104 and the second layer 106. In some embodiments, the energy band gap of the first layer 104 is different from the energy band gap of the second layer 106. In other embodiments, the energy band gaps of the first layer 104 and the second layer 106 are the same. Using materials with different energy band gaps makes the photonic device 100 a heterostructure device.

Although not illustrated in FIG. 1A or 1B, one or both of the embodiments of the photonic device 100 illustrated in FIG. 1A or 1B may further comprise an encapsulant material at least within the gap 105 that embeds the bramble of nanowires 108. The encapsulant material is an insulator material that is one of transparent and semi-transparent to electromagnetic radiation in one or more of visible, UV and IR spectrums (i.e., 'optically transparent'). In some embodiments, the encapsulant material includes, but is not limited to, one or more of an oxide, a nitride and a carbide of any of the semiconductor materials listed above that is optically transparent. In other embodiments, the encapsulant material may be one or more of an oxide, a nitride, and a carbide of a metal, such as titanium or gallium, for example, that is optically transparent. In some embodiments, the encapsulant material includes, but is not limited to, a polymer, which is optically transparent that can withstand device processing temperatures above about 100° C. For example, the polymer insulator material may be an optically transparent polyimide.

According to various embodiments, one or more of the first layer 104, the second layer 106 and the nanowires of the bramble 108 of the photonic device 100 are doped with a dopant material to provide a level of electrical conductivity to the respective layers or structures. In some embodiments, the photonic device 100 further comprises a p-n junction. For example, in one or more of a solar cell, an LED, a laser and a photodetector application, the photonic device 100 comprises a p-n junction. In other examples, the photonic device 100 may comprise a Schottky junction instead of or in addition to the p-n junction.

Depending on the embodiment, the p-n junction may be located one or more of in the nanowires of the bramble 108, between the nanowires of the bramble, between the nanowires of the bramble and the first layer 104, between the nanowires of the bramble and the second layer 106, and between the first layer 104 and the second layer 106, and includes a p-i-n junction with its scope. For example, with respect to the embodiment illustrated in FIGS. 1A and 1B, the first layer 104 and the second layer 106 may comprise a p-type dopant material and the bramble of nanowires 108 may comprise an n-type dopant material (dopant types not illustrated).

In another example, the first layer 104 and the set of nanowires integral to the first layer 104 may be p-doped, while the second layer 106 and the set of nanowires integral to the second layer 106 are n-doped. A p-n junction is formed between the nanowires of the bramble 108 that make contact within the gap 105. Moreover, if an axial region at the second ends of one or both sets of these contacting nanowires is undoped, a p-i-n junction is formed in the gap 105. In another example, the bramble of nanowires 108 comprises both a p-type dopant material and an n-type dopant material in separate regions along the axial length of the nanowires. In another example, the first layer 104 is p-doped, the second layer 106 is n-doped, and the bramble of nanowires 108 are undoped, such that the nanowires of the bramble 108 that connect between the first layer 104 and the second layer 106 form the intrinsic region of a p-i-n junction. It is within the scope of the embodiments for the dopant types of any of the examples herein to be reversed among the layers 104, 106 and the respective nanowires of the bramble 108.

Other variations on the location and doping of the photonic device 100 exist and are within the scope of the present invention. For example, the nanowires of the bramble 108 may incorporate one or both of more than one p-n junction or more than one p-i-n junction.

Moreover, the level of doping in each layer may be the same or different. The variation in dopant level may yield a dopant gradient, for example. In an example of differential doping, one or both of the first layer 104 and the second layer 106 may be heavily doped to yield a p+ region providing a low resistivity within the respective layer 104, 106 while the adjacent axial region of the nanowires may be less heavily p-doped to yield a p region. Various p-n junctions are described and illustrated in co-pending U.S. patent application Ser. No. 11/681,068, which is incorporated herein by reference in its entirety.

Figure 2:
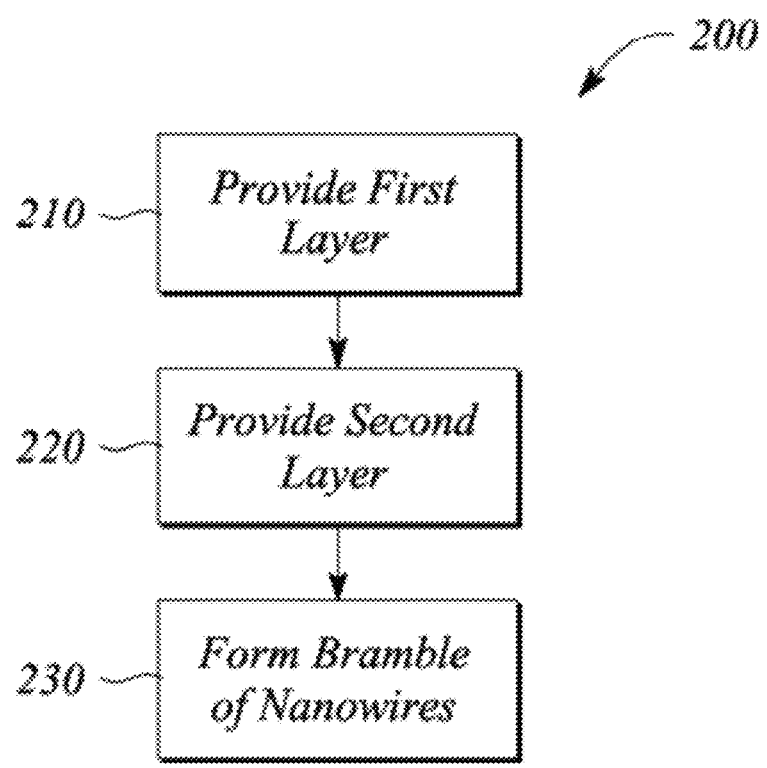
FIG. 2 illustrates a flow chart of a method of making a photonic device according to an embodiment of the present invention.

In another embodiment of the present invention, a method of making a photonic device is provided. FIG. 2 illustrates a flow chart of a method 200 of making a photonic device according to an embodiment of the present invention. The method 200 of making the photonic device comprises providing 210 a first layer of a microcrystalline material on a surface of a substrate. The method 200 of making further comprises providing 220 a second layer spaced from the first layer; and forming 230 a bramble of nanowires between the first layer and the second layer. The bramble comprises a plurality of nanowires having first ends integral to crystallites in each of the first layer and the second layer. The nanowires of the plurality further have second ends that are opposite the first ends. In some embodiments, the nanowires are grown using a metal-catalyzed growth process to form 230 the bramble, such that the nanowires comprise a metal nanoparticle catalyst at the tip of the second ends (i.e., the metallic tip 103). Also, the nanowires of the bramble have random orientations, as defined herein. The random orientations of the nanowires of the bramble are dictated by the randomness of the crystallites in the microcrystalline material, also as defined herein.

In some embodiments, a photonic device similar to the photonic device 100 illustrated in one or both of FIGS. 1A and 1B is manufactured using the method 200 of making a photonic device. In these embodiments, the first layer of a microcrystalline material is provided 210 on the substrate surface and a second layer of a microcrystalline material is provided 220 on the substrate surface horizontally spaced from the first layer by a gap. The bramble of nanowires is formed 230 by growing the nanowires from vertical surfaces and horizontal surfaces of each of the first layer and the second layer. Since the nanowires grow from crystallites in the microcrystalline materials, the grown nanowires have random orientations relative to the horizontal and vertical surfaces of the first and second layers. Moreover, since the nanowires grow from vertical surfaces of the first and second layers that face one another, the nanowires grow in random orientations to extend into the gap in opposing directions. The bramble of nanowires has a wide distribution of angular orientations, which in some embodiments, includes angular orientations less than zero (0) degrees, as measured from a horizontal plane parallel to the substrate surface. A plurality of nanowires grow into the gap to form 230 the bramble of randomly oriented or tangled nanowires; most or some of the nanowires make physical contact across the gap. Moreover, some of the nanowires of the bramble bridge across the gap to connect facing vertical surfaces. The plurality of tangled nanowires of the bramble is relatively dense due to the randomly oriented growth from each of the surfaces into the gap. The bramble of nanowires provides more surface area and increases the probability for photons to make contact the nanowires.

In some embodiments, forming 210 a first layer comprises depositing a semiconductor material on the surface of the substrate in a microcrystalline film. In some embodiments, the microcrystalline film of a semiconductor material is deposited using a chemical vapor deposition (CVD) process, such as plasma enhanced CVD (PECVD), and a semiconductor source gas or gas mixture. For example, a microcrystalline silicon film may be deposited onto a silicon dioxide surface of a substrate using PECVD at a temperature ranging from about 100° C. to about 300° C. and a source gas mixture of silane and hydrogen. In this example, the first layer is a microcrystalline hydrogenated silicon film. Other methods of deposition of microcrystalline films according to the present invention include, but are not limited to, physical vapor deposition, such as sputtering or vacuum evaporation. The first layer is formed 210 with multiple crystallites of varying sizes, as defined above for the microcrystalline structure or layer. A crystallite near the surface in the first layer provides a template for nucleating with a nanowire. The second layer is provided 220 in the same way as the first layer. In some embodiments, where the microcrystalline material of the first layer is the same as the second layer, the first and second layers are provided 210, 220 simultaneously. In other embodiments, the first and second layers are provided 210, 220 sequentially. One or both of masking and etching may be used to form the gap in the microcrystalline layer. The gap is delineated by spaced apart vertical surfaces of the first and second layers that face each other.

In some embodiments, the nanowires are formed 230 by growing the nanowire on the microcrystalline material (i.e., both the first layer and the second layer). In some of these embodiments, growing nanowires comprises an epitaxial growth process to achieve a single-crystalline semiconductor nanostructure. Nanowires are grown epitaxially using a variety of techniques including, but not limited to, catalytic growth using vapor-liquid-solid (VLS) growth, catalytic growth using solution-liquid-solid (SLS) growth, and non-catalytic growth using vapor-phase epitaxy. Catalytic growth is further characterized by being either metal catalyzed or nonmetal catalyzed. The growth is performed in a chemical vapor deposition (CVD) chamber in a controlled environment using a gas mixture comprising nanowire source materials. During catalytic growth, nanowires grow in a predominately perpendicular direction from <111> crystal lattice planes of respective crystallites in the microcrystalline layer. Since the microcrystalline structure of the layer comprises crystallites with random crystal orientations, the nanowires will grow in random directions from some crystallites at the surface of the microcrystalline layer.

For nanodots, the growth is stopped almost immediately after it is started, in some embodiments. In other embodiments, the nanodots form spontaneously on the microcrystalline layer by so-called self-organized growth driven by strain associated with the difference in lattice constants between the nanodots and the crystallites in the respective microcrystalline layer. In some embodiments, a nanodot may be grown from the crystallites as a 'seed' from which a nanowire or nanotube is subsequently grown.

Typical catalyst materials are metals are nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

In some embodiments, forming 230 a bramble of nanowires comprises using a catalytic growth process. In some of these embodiments, the catalytic growth process comprises using vapor-liquid-solid (VLS) growth and a metal nanoparticle catalyst. Nanoparticle catalysts are formed on the surfaces of the microcrystalline layers using any one of a variety of deposition processes. In some embodiments, a nucleation layer of a catalyst material is deposited on the surfaces by electron-beam evaporation. The nucleation layer is annealed into activated nanoparticle catalysts on the surfaces of the microcrystalline layers, for example. The activated nanoparticle catalysts are discontinuous on the surface relative to the nucleation layer. In other embodiments, a metal catalyst material is deposited using electrochemical deposition using a deposition solution comprising a salt of the metal catalyst material. In some embodiments, excess catalyst material may be removed from the surfaces of the microcrystalline layers, for example, by annealing.

In other embodiments, the catalyst particles are suspended in a solution and deposited on the surfaces of the microcrystalline layers as droplets. For example, gold colloidal particles dispersed in toluene may be delivered to the surfaces of the microcrystalline layers in multiple droplets using a pipette, or an inkjet printhead. The toluene may be pumped away in vacuum, leaving the gold nanoparticles on the surfaces to act as catalysts for the VLS growth of the nanowires. In this example, the gold colloidal particles have a diameter of about 10 nm and a nominal concentration of about $5 \times 10^{15}$ $ml^{-1}$.

Nanowire growth is initiated in a CVD reaction chamber using a gas mixture of a nanowire source material that is introduced into the chamber at a growth temperature and using nanoparticle catalysts that are located on the crystallites at the surface of the microcrystalline layers. The activated or nucleating nanoparticle catalyst accelerates decomposition of the nanowire source material in the gas mixture, such that adatoms resulting from decomposition of the nanowire source material diffuse through or around the nanoparticle catalyst, and the adatoms precipitate on the microcrystalline layer surface. In particular, the adatoms of the nanowire material precipitate between the nanoparticle catalyst and the surface of the microcrystalline layer at the respective crystallites to initiate nanowire growth. Moreover, catalyzed growth of the nanowire is continued with continued precipitation at the nanoparticle-nanowire interface. Such continued precipitation causes the nanoparticle catalyst to remain at the tip of the free end of the growing nanowire. As mentioned above, the metal-catalyzed growth process provides a metallic tip on the second end of the nanowire. The metallic tip comprises the metal nanoparticle catalyst used to catalyze the growth process.

For example, indium phosphide (InP) nanowires may be grown on the microcrystalline hydrogenated silicon film by metalorganic CVD (MOCVD). In this example, trimethyilindium and phosphide in a hydrogen carrier gas are used at a growth pressure of about 76 Torr and temperature of about 430° C. Moreover, a gold-silicon alloy material is used as the metal nanoparticle catalyst. The InP nanowires are anchored to the crystallites in the microcrystalline silicon film at the first end and have metallic tips comprising gold at the second end in this example.

In some embodiments, the method 200 of making further comprises doping one or more of the first layer, the second layer and the nanowires, depending on the embodiment. Doping forms a p-n junction generally located between the first layer and the second layer. In some embodiments, the p-n junction is any of the p-n junctions (including p-i-n junctions) described above for the photonic device 100. The dopant materials used and the dopant levels achieved are dependent on the photonic device application and not considered a limitation herein. The method 200 may further comprise forming one or more of a Schottky junction, a heterostructure and a heterojunction between the bramble of nanowires and one or both microcrystalline layers, depending on the embodiment.

In some embodiments, the method 200 of making further comprises embedding at least a portion of the bramble of nanowires in an encapsulant material. For example, the bramble of nanowires on each of the first and second layers of the photonic device 100 may be embedded together in the encapsulant material at least to protect the nanowire bramble in the gap. The encapsulant material is optically transparent and an insulator, such that it does not interfere with photonic reactions with the nanowires or the light absorbing and anti reflective characteristics of the bramble.

In some embodiments, the method 200 of making further comprises forming an electrical connection to electrically access the bramble of nanowires. In some embodiments, the electrical connection is similar to the electrical contacts 107 described above for the photonic device 100 embodiments in FIGS. 1A and 1B. The electrical connection is formed using a deposition method and either a conductive metal material or an appropriately doped semiconductor material. For example, deposition methods including, but not limited to, sputtering and evaporation may be used.

Thus, there have been described various embodiments of a photonic device and a method of making a photonic device employing a bramble of nanowires integral to a microcrystalline material. Also described is a nano-scale antireflector that comprises the bramble of nanowires. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A photonic device comprising:
   a first layer of a microcrystalline material on a substrate surface;
   a second layer of a microcrystalline material on the substrate surface, the second layer being horizontally spaced from the first layer by a gap; and
   a bramble of nanowires between the first layer and the second layer, the nanowires of the bramble having first ends integral to crystallites in each of the first layer and the second layer, the nanowires of the bramble extending into the gap from each of the first layer and the second layer.

2. The photonic device of claim 1, wherein both the first layer and the second layer have respective horizontal surfaces and vertical surfaces relative to a horizontal plane of the substrate surface, the vertical surface of the first layer facing the vertical surface of the second layer, the vertical surfaces being spaced apart to delineate the gap, the first ends of the nanowires of the bramble being integral to crystallites of each the vertical surfaces and the horizontal surfaces.

3. The photonic device of claim 1, further comprising separate electrical contacts to the first layer and the second layer, the bramble of nanowires being electrically accessible by the separate electrical contacts.

4. The photonic device of claim 1, wherein the substrate comprises a material that insulates the first layer from the second layer, each of the first layer, the second layer and the bramble of nanowires independently comprising a semiconductor material.

5. The photonic device of claim 1, wherein the bramble of nanowires comprises one or both of a heterojunction and a p-n junction.

6. The photonic device of claim 1, further comprising a p-n junction located one or more of in the nanowires, between the nanowires, between the first layer and the nanowires, between the second layer and the nanowires, and between the first layer and the second layer.

7. The photonic device of claim 1, further comprising a p-i-n junction between the first layer and the second layer, the bramble of nanowires being an intrinsic region of the p-i-n junction.

8. The photonic device of claim 1, wherein the photonic device is one of a photodetector and a solar cell.

9. The photonic device of claim 1, wherein the bramble of nanowires is a nano-scale antireflector, the nano-scale antireflector being light absorptive both in a wide band of frequencies and over a wide range of incident angles, such that negligible light is reflected from the gap.

10. The photonic device of claim 1, wherein a nanowire extending into the gap from a vertical surface of the first layer is connected to a facing vertical surface of the second layer.

11. The photonic device of claim 1, wherein a nanowire extending into the gap from the first layer is connected to a nanowire extending into the gap from the second layer.

12. A photonic device comprising: a first layer of a microcrystalline material on a substrate surface;
   a second layer of a microcrystalline material on the substrate surface horizontally spaced from the first layer by a gap; and
   a nano-scale antireflector in the gap between the first layer and the second layer, the nano-scale antireflector being light absorptive both in a wide band of optical frequencies and over a wide range of incident angles, such that negligible light is reflected from the gap;
   wherein the nano-scale antireflector comprises a bramble of nanowires, the bramble comprising a plurality of randomly oriented nanowires having first ends integral to crystallites in each of the first layer and the second layer, the nanowires of the bramble extending into the gap from the first layer and the second layer.

13. The photonic device of claim 12, wherein the first layer and the second layer have both vertical surfaces and horizontal surfaces, the vertical surface of the first layer facing the vertical surface of the second layer, the vertical surfaces being spaced apart to delineate the gap, the nanowires extending from crystallites of the vertical surfaces and horizontal surfaces of each of the first layer and the second layer, such that the bramble comprises the nanowires extending into the gap from opposing directions.

14. A method of making a photonic device comprising:
providing a first layer of a microcrystalline material on a substrate surface;
providing a second layer of a microcrystalline material on a substrate surface horizontally spaced from the first layer by a gap; and
forming a bramble of nanowires between the first layer and the second layer, the nanowires of the bramble having first ends integral to crystallites in each of the first layer and the second layer, such that the nanowires of the bramble extend into the gap from opposing directions.

15. The method of making of claim 14, wherein the first layer and the second layer are provided with vertical surfaces and horizontal surfaces relative to the substrate surface, the vertical surface of the first layer facing the vertical surface of the second layer, the facing vertical surfaces being spaced apart to delineate the gap.

16. The method of making of claim 14, wherein forming the bramble of nanowires comprises growing nanowires on vertical surfaces and horizontal surfaces of each of the first layer and the second layer, such that some of the nanowires on each of the first layer and the second layer extend into the gap.

17. The method of making of claim 14, wherein forming the bramble of nanowires comprises growing nanowires from the first layer and the second layer to connect to one another in the gap.

18. The method of making of claim 14, wherein forming the bramble of nanowires comprises growing a nanowire from a vertical surface of the first layer to connect to a facing vertical surface of the second layer, the facing vertical surfaces being spaced apart to delineate the gap.

19. The method of making of claim 14, further comprising providing a p-n junction one or more of in the nanowires, between the nanowires, between the first layer and the nanowires, between the second layer and the nanowires, and between the first layer and the second layer.

* * * * *